United States Patent
Tracht et al.

(10) Patent No.: US 7,243,037 B2
(45) Date of Patent: Jul. 10, 2007

(54) SIGNAL PROCESSING DEVICE, USE OF THE SIGNAL PROCESSING DEVICE AND METHOD FOR SIGNAL PROCESSING

(75) Inventors: Thorsten Tracht, München (DE); Günter Märzinger, Ulrichsberg (AT); Timo Gossmann, Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/354,690

(22) Filed: Feb. 14, 2006

(65) Prior Publication Data

US 2006/0195284 A1    Aug. 31, 2006

(30) Foreign Application Priority Data

Feb. 16, 2005    (DE)    .................. 10 2005 007 088
Jan. 12, 2006    (DE)    .................. 10 2006 001 650

(51) Int. Cl.
*G01R 35/00*    (2006.01)

(52) U.S. Cl. .................. 702/106; 455/102; 455/110; 455/114.3; 375/216; 375/296; 375/324; 375/297; 370/206

(58) Field of Classification Search ................ 702/106; 455/102, 110, 114.3; 375/130, 216, 296, 375/324, 297, 375, 376, 326, 146; 370/206
See application file for complete search history.

(56) References Cited

U.S. PATENT DOCUMENTS

| | | | |
|---|---|---|---|
| 5,598,436 A | 1/1997 | Brajal et al. | |
| 7,061,990 B2 * | 6/2006 | Wright et al. | ............... 375/295 |
| 2003/0058960 A1 | 3/2003 | Lee | |
| 2004/0208157 A1 | 10/2004 | Sander et al. | |
| 2004/0219891 A1 * | 11/2004 | Hadjichristos | ............... 455/102 |

* cited by examiner

*Primary Examiner*—Carol S. W. Tsai
(74) *Attorney, Agent, or Firm*—Eschweiler & Associates, LLC

(57) ABSTRACT

A signal processing device is provided that includes a modulation unit that produces an amplitude element as well as a phase element from components that are applied thereto. A correction device is also provided, in which at least one of the components is supplied and is compared with an ideal nominal value. This is used to produce a correction factor, which is multiplied by the component which has been compared with the nominal value. The correction factor determined is used to correct any offset or distortion of the components produced by analog circuits.

20 Claims, 7 Drawing Sheets

SIGNAL PROCESSING DEVICE, USE OF THE SIGNAL PROCESSING DEVICE AND METHOD FOR SIGNAL PROCESSING

REFERENCE TO RELATED APPLICATIONS

This application claims the benefit of the priority date of German application DE 10 2005 007 088.4, filed on Feb. 16, 2005 and German application DE 10 2006 001 650.5 filed on Jan. 12, 2006, the contents of which are herein incorporated by reference in their entirety.

FIELD OF THE INVENTION

The present invention relates to a signal processing device, in particular for a transmitter. The invention also relates to use of the signal processing device, and to a method for signal processing.

BACKGROUND OF THE INVENTION

Modern communication appliances frequently contain a baseband unit and a radio-frequency unit, connected to it, in their transmitters. The baseband unit is used to preprocess the data to be transmitted. This includes, inter alia, modulation of the phase and amplitude of the data on a so-called baseband signal. The type of modulation used for modulation is in this case dependent on the chosen mobile communication standard. Examples of communication standards such as these are WCDMA/UMTS, GSM, EDGE, Bluetooth, 802.11 and HyperLan.

The baseband signal produced in this way in this case contains a real component I as well as a quadrature component Q, and is accordingly also referred to as an I/Q signal. The sum of the two components contains the modulated signal. In a final step, the digital baseband signal from the baseband unit is converted by means of a digital/analog converter to an analog baseband signal, and is emitted at the output of the baseband unit. In the following text, the expressions analog signal or analog component are intended to mean a signal or component which has a continuous value or is continuous over time. A digital signal or a digital component corresponds to a signal or component which has a discrete value or is present for a discrete time.

A radio-frequency unit which is connected to the output of the baseband unit adds the two components I and Q of the baseband signal and modulates them onto a carrier signal at the desired output frequency. The signal is suitably amplified in the radio-frequency unit, and is then emitted via an antenna.

In practice, the baseband unit and the radio-frequency unit are in the form of integrated circuits in two different semiconductor bodies, and are coupled to one another in a further step. This has the advantage that the baseband unit and radio-frequency unit can be developed separately from one another in order to take account of different conditions during manufacture, different requirements and different operating parameters. In addition, it is possible to use different manufacturing techniques and circuit techniques optimized to radio-frequency and baseband signal processing.

Analog circuits, in particular at the interfaces between the baseband unit and the radio-frequency unit, can lead to distortion and interference in the baseband signal that is produced. Interference and distortion such as this is referred to as an IQ signal error ("ISE" for "IQ signal error"). These have a direct influence on the output accuracy of the overall system. It is thus necessary to take account of any possible signal error even during the development of the circuits. This is done, for example, by derating individual components in order to compensate for the signal fluctuations caused by the interference. However, any enlargement increases the power consumption of a circuit, and the space that it occupies. If, furthermore, the baseband unit and the radio-frequency unit have different design requirements, the IQ signal inaccuracies caused in the interface could be sufficiently great that it is no longer possible to satisfy the desired performance parameters of the overall system.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The invention is directed to a signal processing circuit, for a transmitter for example, which operates more reliably. The invention is also directed to a method for signal processing, by means of which interference and inaccuracies in a transmission signal are corrected. Another aim is to specify a use for a signal processing circuit such as this.

In one embodiment of the invention, the signal processing device has a first connection and a second connection, which are designed to supply a signal with a first component and a second component. A modulation unit is designed to convert the components to an amplitude element and a phase element. In this case, the amplitude element forms a third component, and the phase element a fourth component. Furthermore, at least one correction device is provided, and has a control input for supplying a nominal value. A signal input of the correction device is configured to supply one of the first, second, third or fourth components. The correction device compares the nominal value with the one component supplied at the signal input, and uses this to produce a control signal as a function thereof. Furthermore, a multiplier is provided, which is configured to change the amplitude of the one of the components as a function of the control signal produced by the correction device. The multiplier is in this example connected to one of the connections of the modulation unit.

The signal processing device is used to correct any offset as well as any statistical error in one of the components. This error may be contained in the amplitude element, or else in the phase element of the component. The correction process is carried out in a suitable manner by comparison of the respective component with a nominal value, from which a corresponding correction value is produced. In the multiplier, the correction value leads to a change in the amplitude or phase element of the corresponding component.

In one aspect of the invention, the first and the second component are supplied as analog components to the signal input. Furthermore, an analog/digital converter is in each case connected to the first connection and to the second connection in order to convert the analog signals which are applied on the input side to a first and a second digital component, respectively. The outputs of the first and second analog/digital converters are connected, for example, to the modulation unit. The modulation unit may in this example be configured to convert the first and second digital components to a third and a fourth digital component. The correction device can be supplied with the nominal value, as well as the first component supplied at the signal input, likewise in digital form.

In one embodiment of the invention, the multiplier is connected between the output of the first and/or second analog/digital converter and the respective input connection of the modulation unit. The multiplier is configured to change an amplitude element or a phase element of the first and/or second digital component. This advantageously makes it possible to determine and correct individual errors, for example an amplitude offset as well as an amplitude and phase offset, between the two components I and Q.

In another embodiment of the invention, the multiplier is coupled on the input side to the tap on the modulation unit for the third digital component, which forms the amplitude element. A signal input of the correction device is connected to the input of the multiplier. In this embodiment, the correction device and the multiplier are thus configured to change the amplitude element of the third component. This embodiment has the advantage that amplitude information which already exists about the overall signal can be used in the form of the third component so that there is no need to calculate the amplitude information within the correction device from the first and second components, which form the complex digital baseband signal. This minimizes the complexity for error determination and subsequent correction. The space occupied and the power consumed can thus be reduced in this example.

Both embodiments allow the correction of a steady-state amplitude or phase error which occurs owing to component fluctuations within the analog circuit elements in the baseband unit and in the radio-frequency unit and, in particular, as a result of injected interference at the interface between the baseband unit and the radio-frequency unit.

In another embodiment of the invention, the multiplier is configured to multiply an amplitude of a digital signal, which is applied on the input side, by a factor which is derived from the control signal. The multiplier thus multiplies the digital value by a factor which is derived from the control signal for the correction device and thus from an amplitude error with respect to an ideal signal.

In another embodiment, the correction device is configured to divide the nominal value by a factor which is derived from the digital component supplied to it. For this purpose, the control circuit determines any discrepancy in an amplitude or phase element of the first digital component from the nominal value. In this example the factor which is derived from the division process forms a control value by which the multiplier multiplies the digital signal applied on the input side.

In still another embodiment of the invention, a filter device is connected between the first and the second connection for the signal processing device and the first and second analog/digital converter. This is used to suppress undesirable radio-frequency analog signal elements, which the analog/digital converters do not convert without errors. In another embodiment, a digital filter with a low-pass filter characteristic is connected downstream from each of the outputs of the first and second analog/digital converters. In one example embodiment, these digital filters are in the form of interpolation filters and are used to interpolate the output signals from the analog/digital converters, which operate at low sampling rates, in order in this way to produce signals which are suitable for processing at higher sampling rates.

In yet another embodiment, the taps for the third and the fourth digital component are coupled to a phase modulator.

In this example, the signal processing device is in the form of an integrated circuit in a semiconductor body.

The signal processing circuit is suitable, for example, for use in a radio-frequency unit in a transmitter for time-slot-based signal transmission. A comparison of a test signal with the ideal value, as well as the calculation of the correction value, can thus be carried out during a time period in which no signal transmission is intended by the transmitter.

The analog real component and the analog quadrature component are thus converted to digital components in order to correct any steady-state error component within the two analog components. Furthermore, a nominal value is produced and is compared with at least one of the digital components. A control value is produced from this comparison. The digital component which has been compared with the nominal value is then changed by the control value, thus correcting the error component with respect to the nominal value. The process of comparison with the nominal value can in this case be carried out before the conversion of the first and the second digital components to an amplitude element and a phase element.

The digital real component and the digital quadrature component are thus compared with their respective ideal value, compensating for any amplitude or phase error. A comparison such as this before the conversion to the amplitude and phase elements allows individual correction of the respective digital component in order in this way to also compensate for any amplitude offset between the two digital components. In another embodiment, the nominal value is compared with the third digital component, which represents the amplitude element, and the control value is produced from this.

In one embodiment, an average value is determined from the component to be compared with the nominal value. The nominal value is then divided by the average value.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention will be explained in detail in the following text using exemplary embodiments and with reference to the drawings, in which.

DETAILED DESCRIPTION OF THE INVENTION

Figure 1A:
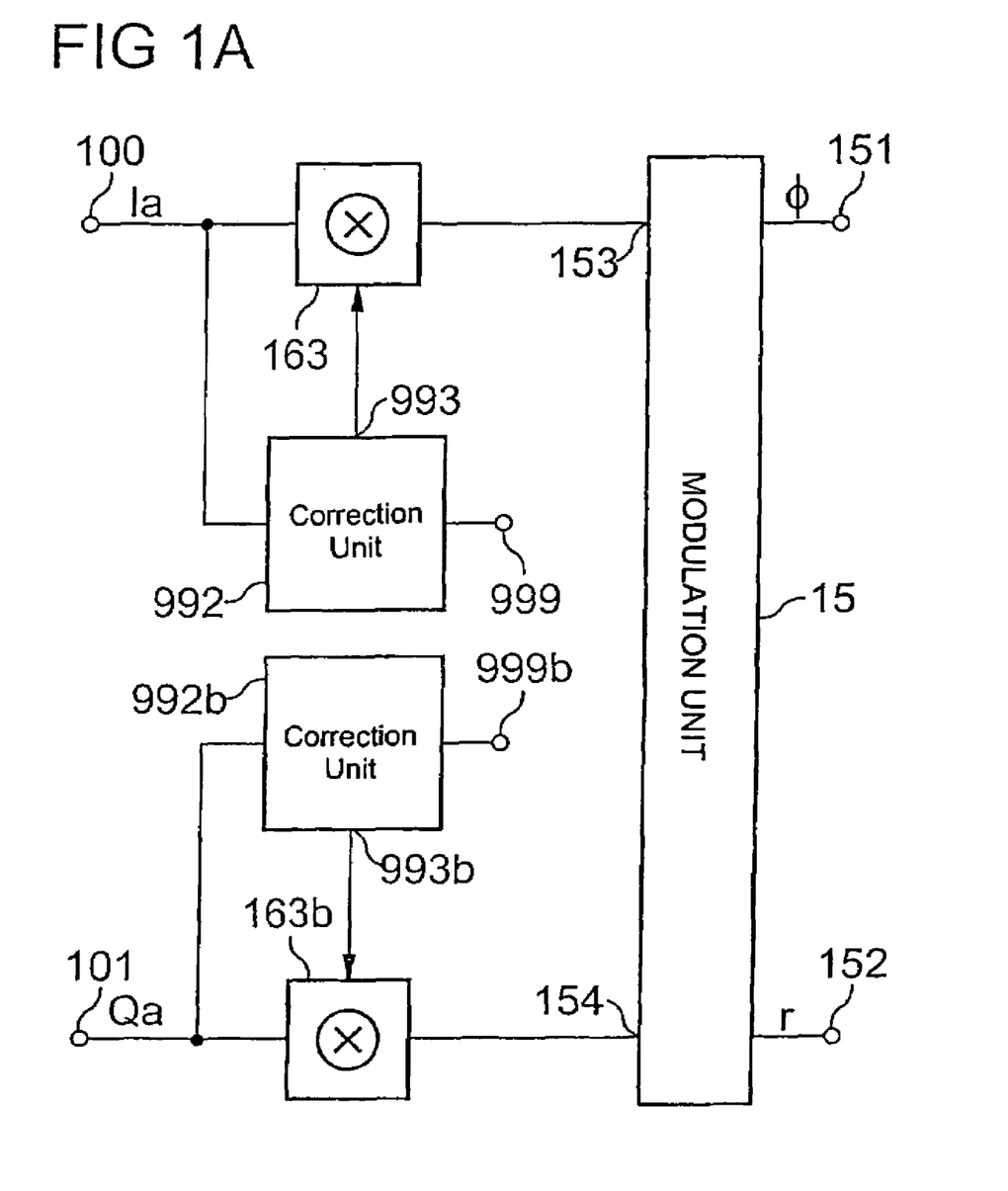
FIG. 1A is a block diagram illustrating a first exemplary embodiment of the invention.

FIG. 1A shows a first exemplary embodiment of the signal processing device according to the invention. A signal which is formed from a first real component Ia and a second quadrature component Qa is supplied to the circuit via signal inputs 100, 101.

Data to be transmitted is coded as a sequence of so-called symbols within the two components Ia and Qa on the basis of a modulation type. Examples of modulation types are FSK (frequency shift keying), PSK (phase shift keying), QPSK (quadrature phase shift keying), QAM (quadrature amplitude modulation), OFDM (orthogonal frequency division multiplexing), FSS (frequency spread spectrum) as well as combinations thereof from specific embodiments of these modulations such as MSK (minimum shift keying), GMSK (gauss minimum shift keying) or DQPSK (differential quadrature phase shift keying).

It may be necessary to subject the signal components to corrective processing in the signal processing device. By way of example, the supplied signal can be predistorted for distortion which occurs later in the transmission path. Furthermore, the signal components may already be subject to errors even when supplied, and this will be described in more detail later on.

Correction units 992 and 992b as well as multipliers 163 and 163b are provided in the circuit for this purpose. In the example the first component Ia is supplied both to the multiplier 163 and to the correction unit 992. A control signal is produced in the correction unit 992 as a function of a comparison of the supplied component with a nominal value at the input 999 of the correction unit 992, and is emitted at the control output 993. The control signal is supplied to the multiplier 163, where it is multiplied by the first component Ia. The second signal path is also set up for the quadrature component Qa in the same way.

The output of the multiplier 163 is connected to one connection 153 of a modulation unit 15 for supplying the corrected first component. The second corrected component is supplied from the multiplier 163b to the modulation unit 15 at a second connection 154. The corrected components are converted in the modulation unit 15 to a component r, which represents an amplitude element, and to a component φ, which represents a phase element, which are emitted at the taps 152, 151, respectively, for further processing.

Figure 1B:
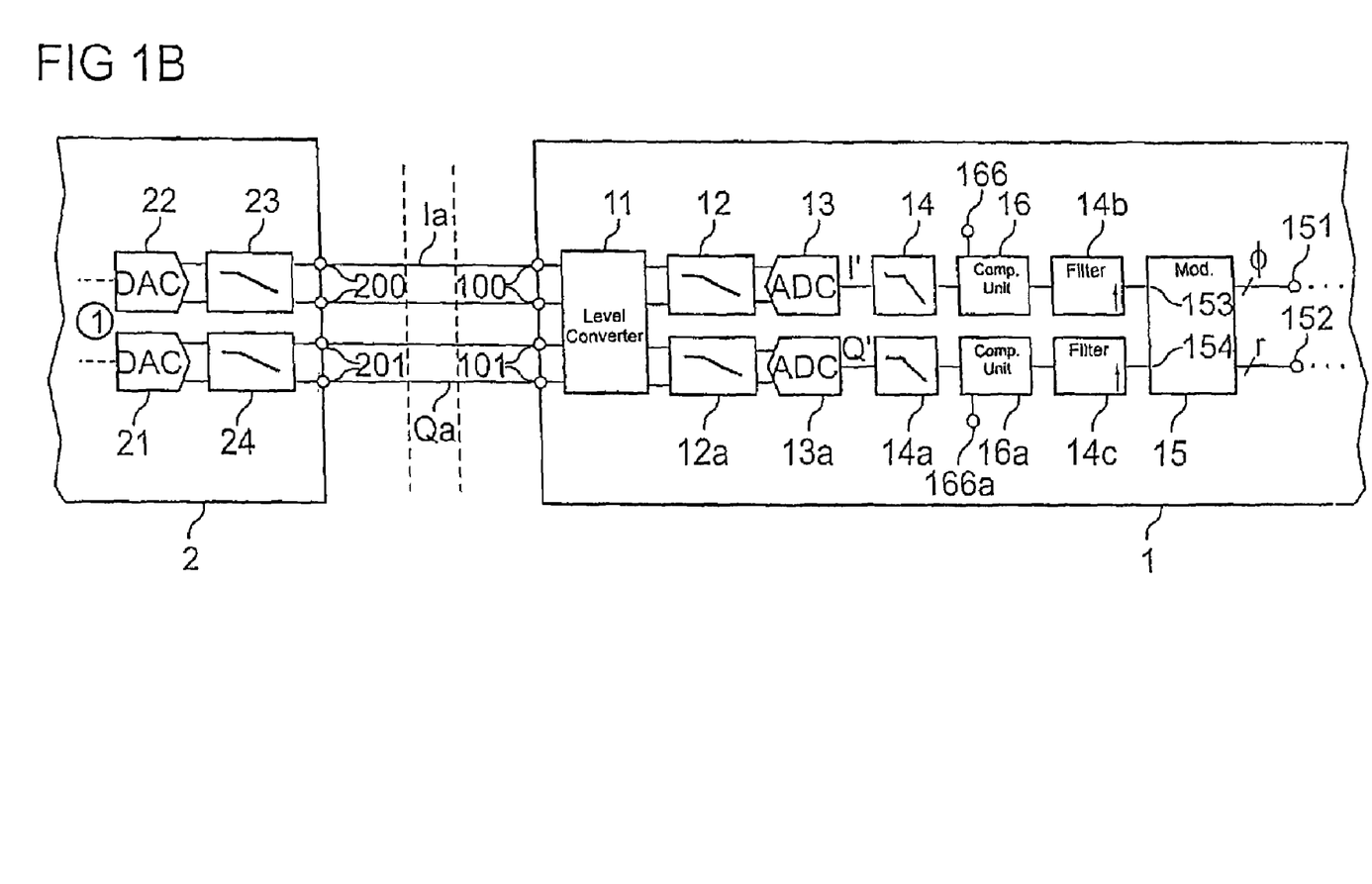
FIG. 1B is a block diagram illustrating a second exemplary embodiment of the invention.

FIG. 1B shows a second embodiment of the signal processing device 1 according to the invention which is implemented in a semiconductor body. Components which have the same effect and/or the same function have the same reference symbols as those illustrated in FIG. 1A. The circuit is configured for push-pull signal processing in this example. On its surface, the semiconductor body has a plurality of connecting contacts 100, 101, which are configured to supply the analog baseband signals. The analog baseband signals are produced by a baseband unit 2, which is in the form of an integrated circuit in a second semiconductor body.

In the illustrated embodiment, the baseband unit 2 contains digital/analog converters 21, 22, which convert the digital baseband signal, which comprises two components, to an analog baseband signal. The two components are filtered via two low-pass filters 23 and 24, and are produced at the outputs 200, 201.

The analog baseband signal has a first real component Ia as well as a second quadrature component Qa, and is also referred to as the I/Q signal.

In practice, each analog signal processing step, that is to say for example the conversion process to analog components Ia, Qa in the baseband signal unit 2, or else the connection between the baseband signal unit 2 and the radio-frequency unit 1, produces differences as a result of lithographic processes and component scatters. These differences lead to an amplitude offset between the two components Ia, Qa, to a phase offset and to a DC voltage offset on one of the components. The differences, which can interfere with the further processing, are also referred to as the impairment.

The impairments produce additional signal elements in the components, and thus in the output signal, which in the worst case lead to data transmission errors. Furthermore, the spectral characteristics of the output signal are varied. In conventional radio-frequency units, this leads to a greater power consumption and to measures additionally being required to suppress the undesirable signal elements.

A correction unit is provided for this purpose in the radio-frequency unit according to the invention. For this purpose, the connections 100 and 101 on the surface of the semiconductor body are connected to the inputs of a level converter 11. This is used to trim the input levels of the components Ia and Qa for subsequent signal processing.

The outputs of the level converter 11 are connected to the inputs of second low-pass filters 12 and 12a. In the present embodiment, these are in the form of third-order Butterworth filters with a low-pass filter characteristic and a cut-off frequency of 500 kHz. The low-pass filters 12 and 12a in this example are tuned to the respective communication standard for which the radio-frequency device is intended. The bandwidth of the analog components Ia and Qa is taken into account during this process.

The outputs of the low-pass filters 12 and 12a are connected to analog/digital converters 13 and 13a. The analog/digital converter 13 converts the first analog component Ia, to a digital component I'. The second analog/digital converter 13a produces a second digital component Q' from the analog component Qa. On the output side, the two analog/digital converters 13 and 13a are connected to the inputs of two low-pass filters 14 and 14a. The low-pass filters suppress the higher-frequency components of the components I' and Q' which are produced during the digitization process by the two analog/digital converters 13 and 13a.

The outputs of the interpolation filters 14 and 14a are connected to the compensation devices 16 and 16a. The compensation device 16 has a control input 166, while the compensation device 16a has the control input 166a. A nominal signal can be supplied to each of these, which represents the ideal value of an amplitude of the digital component I' or Q', respectively.

The two correction devices 16 and 16a compare the amplitude element of the digital signal applied to the input side with the nominal value, and use this to produce a control value. This control value is used to vary the amplitude element of the corresponding digital component I' or Q'. The nominal value in this case corresponds to the ideal amplitude element without the distortion caused by the analog circuits and the interference at the interface between the baseband unit 2 and the radio-frequency unit. For example, the ideal value is produced by the baseband unit. However, it can also be predetermined in a memory. The control signal that is produced changes the amplitude element of the digital component I', Q' so as to correct the offset or amplitude offset that is still present in the digital component.

The outputs of the correction units 16 and 16a are connected to two interpolation filters 14b, 14c. The outputs of these two filters are connected to the input connections 153, 154 of a modulation unit 15. The filters are used to convert the digital signal coming from the analog/digital converter at a first rate to a second, higher sampling rate. This is expedient since the correction device and the upstream low-pass filters operate at a sampling frequency which is as low as possible, in order to save power. On the other hand, the modulation unit 15 requires higher sampling rates. The filters 14b and 14c thus interpolate the corrected signal, and produce additional intermediate values. By way of example, the sampling rate is increased by the interpolation filter by a factor of 16.

The modulation unit 15 uses the respective corrected digital components I'' and Q'' which are now present to produce an overall amplitude element r and a phase element ϕ. The amplitude element r is emitted at the output 152 of the modulation unit 15 as a third digital component. The phase element ϕ at the output 151 of the modulation unit 15 represents the fourth digital component. The third and the fourth digital component r, ϕ can now be processed further in further circuits, for example in a phase modulator that is connected, and can be modulated onto the carrier frequency. The phase element ϕ at the output 151 in this case modulates the phase of the carrier signal. The amplitude element r at the output 152 is used to adjust the amplitude of the phase-modulated output signal.

Accordingly, in this embodiment, any offset which is caused by the analog circuit elements in the baseband unit 2 and in the radio-frequency unit 1, or any distortion, is corrected by the correction devices 16 and 16a for the respective digital components I' and Q'. This makes it possible to correct or compensate for an individual error on one of the two components which, for example, is caused by component fluctuations in the analog circuit elements. Any amplitude and phase offset between the two digital components I' and Q' is likewise determined and corrected.

Figure 2:
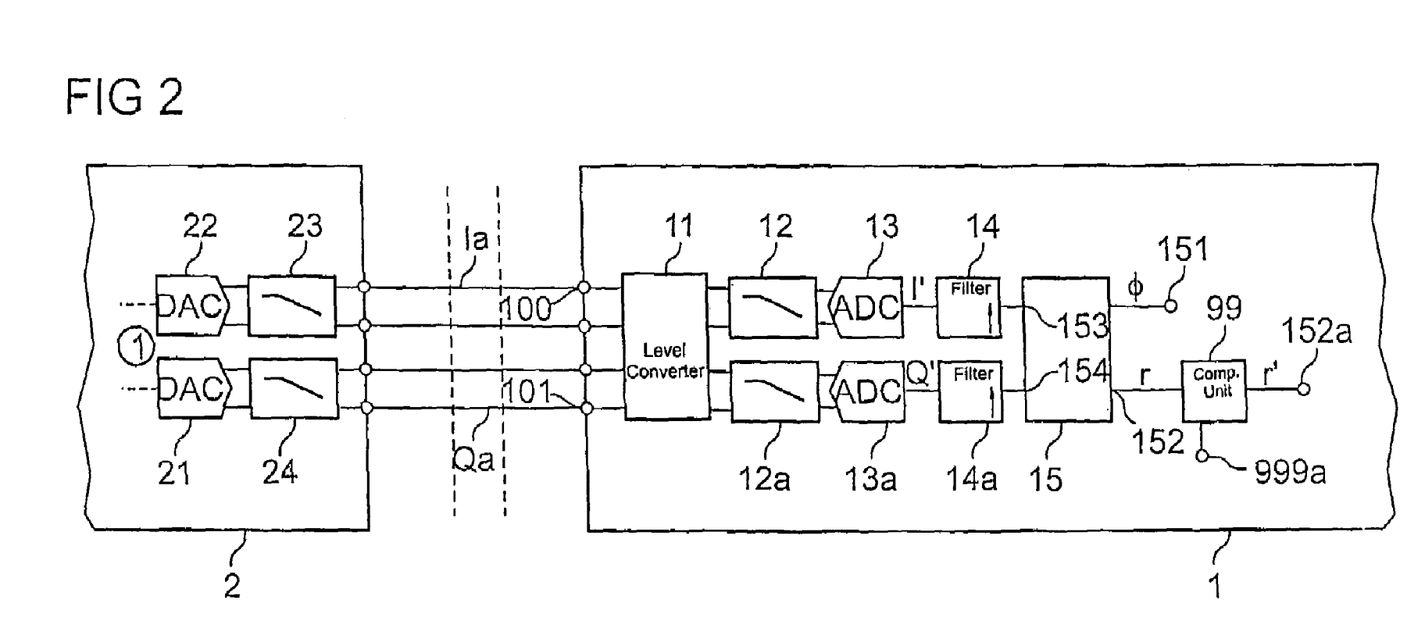
FIG. 2 is a block diagram illustrating a third exemplary embodiment of the invention.

FIG. 2 shows a third embodiment of the radio-frequency circuit according to the invention. In this case as well, identical reference symbols mean components having the same effect or the same function. In this embodiment, the outputs of the two interpolation filters 14 and 14a are connected directly to the connections 153 and 154 of the modulation unit 15. In this case as well, the modulation unit 15 uses the respective phase element and amplitude element of the digital components I' and Q' to produce an overall phase element ϕ, which is produced at the output tap 151 of the modulation unit 15. The output 152 of the modulation unit 15 is now connected to the compensation and correction unit 99, which has a control input 999a, to which the nominal signal can be supplied.

The nominal signal represents a value of the overall amplitude element r ignoring any offset caused by component scatters and the interface between the individual components. The third component r', which is changed by the nominal signal, is emitted at the output 152a. In this case as well, the nominal signal representing or associated with the ideal value of the overall amplitude element is produced by the baseband unit. The production of the nominal signal by the baseband unit also allows data items to be transmitted to be used as test data for the comparison with the ideal values, since the baseband unit has knowledge of the ideal value of the data to be transmitted.

Figure 4:
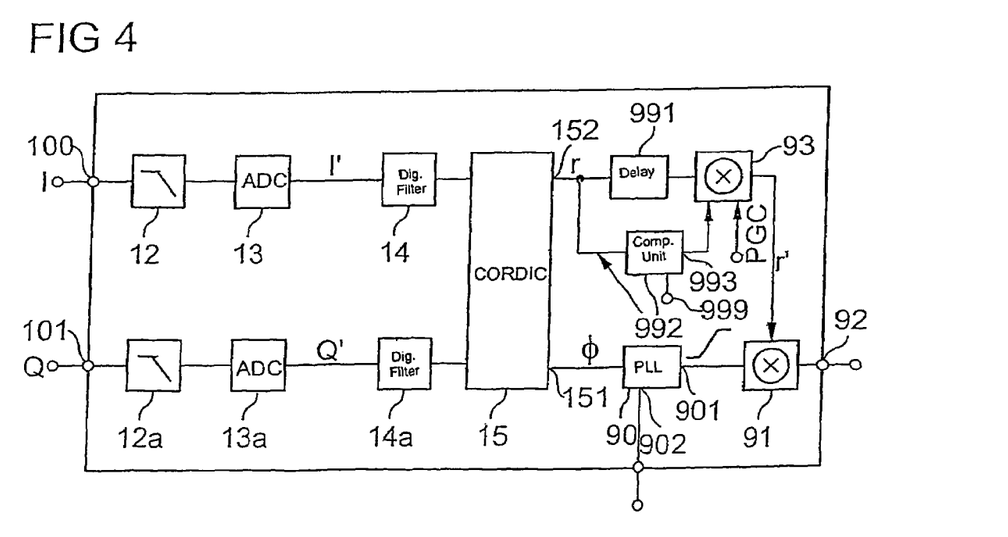
FIG. 4 is a block diagram illustrating a detail of the third exemplary embodiment of the invention.

FIG. 4 shows a more detailed embodiment of the signal processing device based on the exemplary embodiment shown in FIG. 2. The signal processing 1 according to the invention is in this example configured for single-ended signal processing. The inputs 100 and 101 thus each comprise one connection on the surface of the semiconductor body. The inputs 100 and 101 are connected to a low-pass filter 12, 12a, whose outputs are connected to the analog/digital converter 13 or 13a, respectively. The digital components I' and Q' which are obtained by the analog/digital conversion of the analog components I and Q may have high frequency digitization noise that are suppressed by the digital filters 14 and 14a and are passed to the inputs of the modulation circuit 15. The output 151 for the fourth component under the phase element ϕ is connected to a control input of a phase locked loop 90. The phase locked loop 90 is in the form of a two-point modulator, and has a signal output 901, at which the phase-modulated carrier signal can be tapped off. A reference signal for carrier signal production is in this case supplied to the signal processing device according to the invention at the input 902 to the phase locked loop 90.

The output 152 for the third component with the digital amplitude element r is connected to a delay circuit 991. The delay circuit 991 delays the amplitude element r by a variable time period. The time period is designed such that the amplitude element and the phase element are always synchronized to one another and such that there is no time offset, or only a small time offset, between the two components in this example. In addition, the delay unit 991 is used to provide the control device 992 with sufficient time to determine and to produce the necessary control signal.

For this purpose, the input side of the control device 992 is connected to the output 152 of the modulation unit 15. This has a nominal value input 999 for supplying the nominal value signal. The control device 992 compares the ideal nominal value with the average value of the amplitude element r and uses this to produce a factor which is emitted in the form of a control signal at the output 993. The output 993 is connected to a corresponding control input of a multiplier 93 which multiplies the factor given by the control signal by the delayed amplitude element r, and thus compensates for any offset there may be in the analog components I and Q. The multiplier 93 also contains control inputs for supplying power monitoring signals PGC by means of which the level of the amplitude element, and thus the level of the overall signal, is defined in order to determine the output power.

This input is also used to supply signals for a "power ramping" function. A "power ramping" function allows the switching-on process and the switching-off process of the signal to be transmitted to be controlled in time-slot-based transmission methods. Before the actual payload data transmission, the carrier signal is amplified to a desired output level. A "power ramping" function is used by packet-oriented and time-slot-based communication standards. Examples of this include, inter alia, GSM and EDGE, WCDMA/TDD, 802.11, HyperLan and Bluetooth and other mobile radio systems which operate using TDMA methods (Time-Division Multiplex Access).

The output of the multiplication circuit 93 is connected to a mixer 91 which converts the now modified amplitude element r', to which the factor and the power monitoring signal have been applied, to the phase-modulated signal, and emits this at the output 92 of the signal processing circuit according to the invention.

Figure 3:
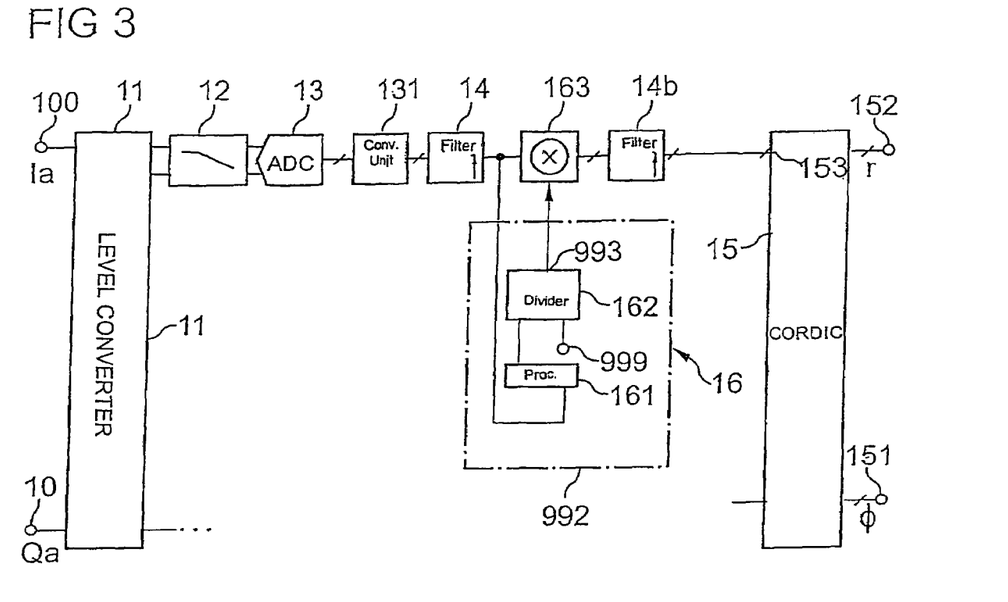
FIG. 3 is a block diagram illustrating a detail of the second exemplary embodiment of the invention.

FIG. 3 shows a further embodiment of the signal processing circuit according to the invention for single-ended signal processing, which is designed to compensate for any offset between the digital components I' and Q' before the modulation to the phase element and amplitude element.

For this purpose, the inputs for the analog components I and Q are connected to a level converter 11. The embodiment illustrated in FIG. 3 shows only the signal path for the analog and digital components Ia, I', for clarity reasons. The second signal path for the quadrature component Q, Q' is also formed in the same way.

The output of the level converter 11 is connected via a filter 12 to the input of the analog/digital converter 13. The unsigned digital signal of the component I' is converted to a signed digital signal I' in a circuit block 131 which is connected downstream from the output of the analog/digital converter 13. In one example this is done by means of a suitable transformation. The digital component I', which is now signed, is filtered in a filter 14. The output of the filter 14 is connected on the one hand to the multiplication circuit 163 and on the other hand to a circuit 161 which is used to determine and to form the average of the digital component I' applied on the input side. The average value of the digital component I' is supplied to a further circuit 162, which divides the nominal value applied to the input 999 by the average value.

The result of this division forms a factor by which the digital component I' is multiplied in order in this way to obtain the ideal value. This factor is emitted at the output 993, and is supplied to the input of the multiplication circuit 163. On the output side, the multiplication circuit 163 is connected to a further filter 14b. The output of the filter 14b is coupled to the input connection of the modulation circuit 15.

Figure 5:
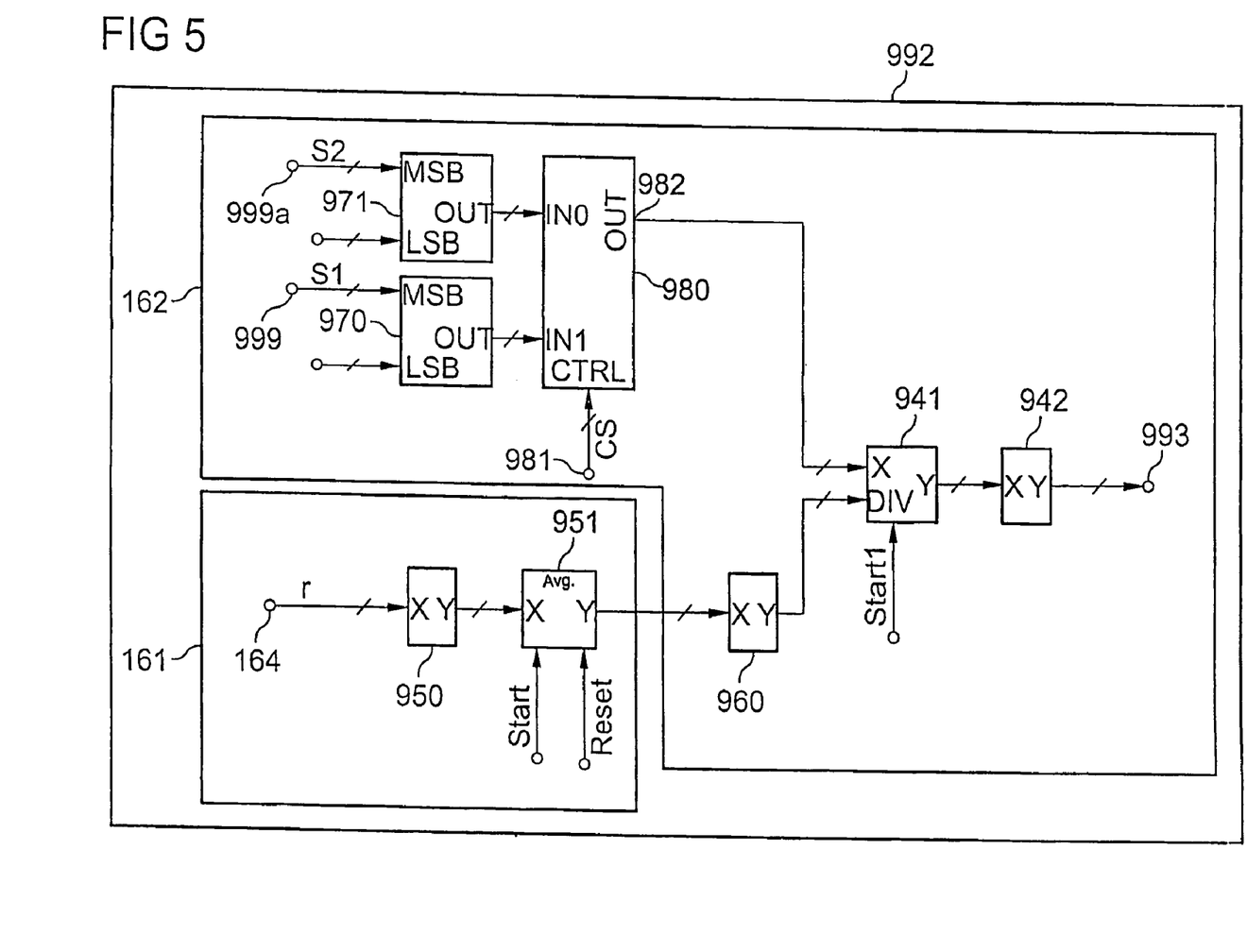
FIG. 5 is a block diagram illustrating an exemplary embodiment of the correction device.

FIG. 5 shows a more detailed embodiment of the correction device 992 with two main components 161 and 162, that may be employed in the embodiments shown in FIGS. 1, 2, 3 and 4. In this example, the correction device 992 is configured to process nominal value signals for a different communication standard. Depending on the communication standard, an optimum exists for correction of the offset or of the amplitude offset between the analog components. The circuit 162 thus contains the elements 970, 971 and 980, which comprise a multiplexing unit, and produce one of the two nominal values S1 or S2 at the output 982 depending on a control signal CS which is supplied to the control input 981. The control signal CS in this example indicates the mobile radio standard being used, and thus the type of modulation being used.

In one example, the 16-bit long digital nominal signal S1 or S2 is extended to a length of 24 bits. This is done by attaching 8 bits to the nominal value, which comprises 16 bits, by means of the switching elements 970 and 971, as LSB bits. The first 16 bits of the word emitted from the units 970 and 971 thus contain the corresponding nominal value S1 or S2, while the other 8 bits contain the value 0. The multiplexing unit 980 emits one of the two now extended nominal values at its output 982, as a function of the control signal at the control input 981. This is supplied to the element 941 as the divisor for division purposes.

The dividend which is applied to the input Div is determined from the average value of the amplitude element of the respective component. For this purpose, the amplitude element at the input 164 is processed in the elements 950, 951 and 960. In detail, the element 950 removes the mathematical sign from the digital value, and supplies the now unsigned 24-bit long data word to the averaging device 951. This produces an average value from, for example, 128 individual values, which is preprocessed once again in the unit 960 and is supplied to the element 941 as the divisor.

From a start signal Start1, the circuit 941 divides the nominal value at the input by the average value of the amplitude component at the input Div. On the output side, the element 941 is connected to a correction circuit 942 which preprocesses the signal and produces it as a multiplication factor at the output 993. In addition, the unit 942 is used as a memory, which stores the multiplication factor until the next process of determining a new multiplication value is carried out. This means that it is also possible to react to dynamic changes in the analog circuit elements in the baseband unit and in the radio-frequency unit, for example as a result of temperature fluctuations.

The embodiments of the signal processing circuit illustrated here are suitable in one example for time-slot-based or packet-oriented data transmission methods. Methods such as these are used, for example, in the Bluetooth, GSM, EDGE, WCDMA/TDD, 802.11 and HyperLan mobile radio standards. By way of example, a correction factor is determined before a data-transmitting time slot by processing a test sequence composed of known data items in the baseband unit, and by emitting this sequence from the baseband unit. The radio-frequency unit converts the analog known signals to digital signals, and compares them, as illustrated, with the nominal values. The correction factor which is used for the next data transmission in the next time slot can be determined from this. In another embodiment, the embodiments according to the invention of the signal processing device are used for data transmission methods which are continuous over time. One example of this is WCDMA/FDD, which is used by the UMTS communication standard. In this case, an average value is determined from the amplitude element of the digital components I, Q and R, and the correction factor is produced from this in parallel during one transmission process.

Figure 6:
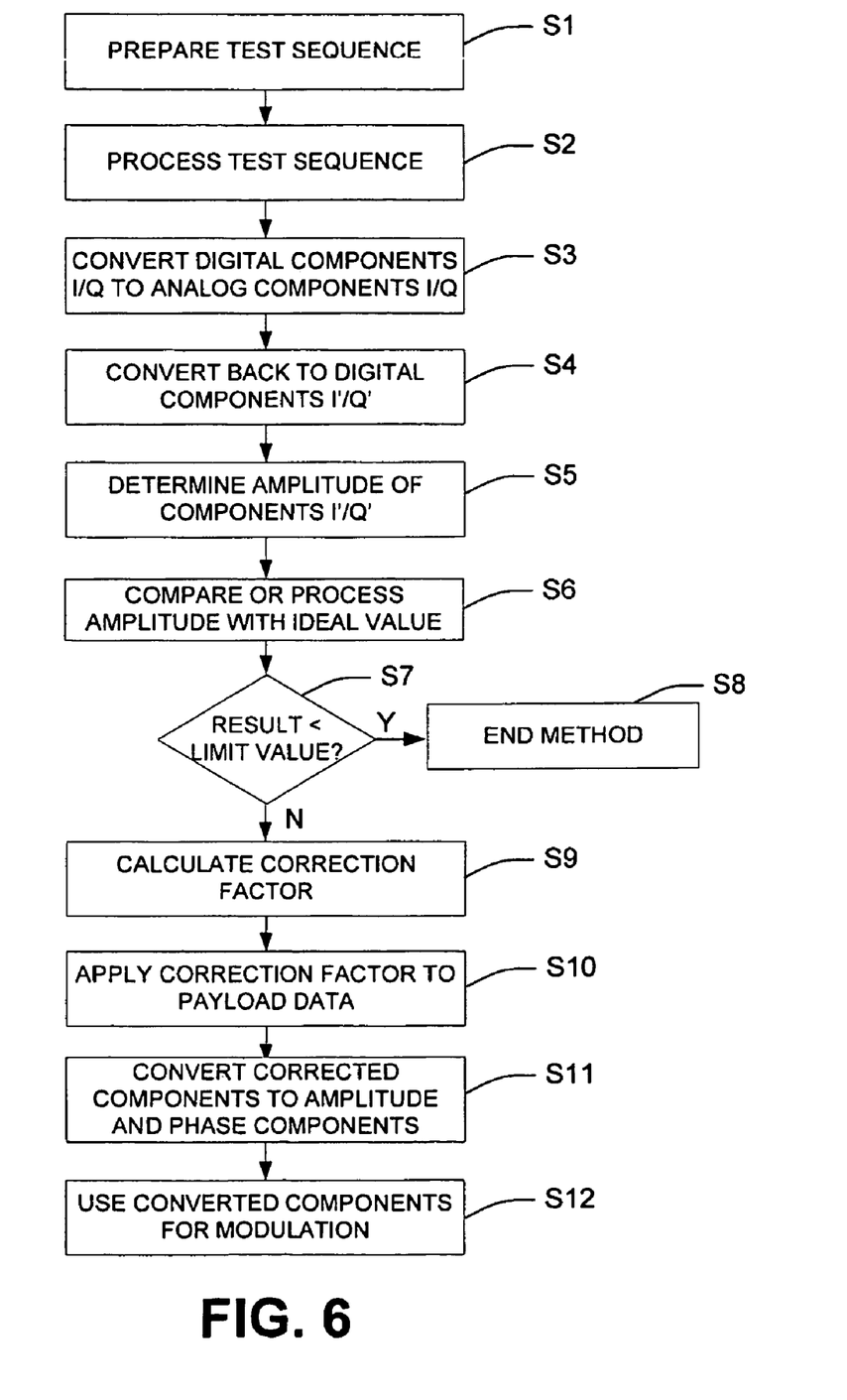
FIG. 6 is a flow chart illustrating a first exemplary embodiment of the method according to the invention.

FIG. 6 illustrates a method for signal processing and, in particular, correction for any inaccuracy or interference caused by the analog switching elements in the baseband unit or in the radio-frequency unit according to one embodiment of the invention. While the method and other methods of the invention are illustrated and described below as a series of acts or events, it will be appreciated that the invention is not limited by the illustrated ordering of such acts or events. For example, some acts may occur in different orders and/or concurrently with other acts or events apart from those illustrated and/or described herein, in accordance with the invention. In addition, not all illustrated actions may be required to implement a methodology in accordance with the invention.

The flowchart of the method illustrated in FIG. 6 uses time-slot-based data transmission. Any offset is thus corrected between two successive time slots in which data is transmitted. A test sequence whose ideal I and Q values are known is prepared at 1. For example, the test sequence may be a PRBS (PRBS: pseudo-random bit sequence) with a specific length. This sequence, comprising a string of bits, is processed at S2, and a real component I and a quadrature component Q are produced from it. During the processing, the bits of the test sequence are coded into symbols, and the symbol are coded in accordance with a preselected modulation method into the phase and amplitude of the real and quadrature component, respectively.

The present digital values in the form of the digital components I and Q are converted to analog components I and Q at S3. During this act and during the subsequent processing, for example by means of filtering, interference is added to the signal which until now has been ideal, thus resulting, for example, in the offset or an offset between the two analog components I and Q.

These erroneous components I and Q are now converted to digital components I' and Q' at S4. The amplitude of the I' and Q' components is then determined at S5, and this amplitude is compared with the ideal value at S6. A measurement at S5 and the comparison at S6 can be carried out, for example, by averaging over a plurality of values. This average value is then processed suitably with the nominal value. In one embodiment, the ideal value is divided at S6 by the average value determined at S5, and determines the result of this division.

If this result at S7 is less than a predetermined limit value, then the method is ended at S8. If the result of the comparison value at S6, which at the end characterize the impairments and thus the distortion with respect to the ideal value, is, in contrast, greater than the limit value, then the method is continued at S9.

An alternative embodiment is indicated by the dashed path which leads directly from S6 to S9. In this case, no comparison is carried out with a limit value. This has the advantage that the time which is required for a comparison process is saved. In one implementation of the method in a circuit, the switching elements which are required for the comparison process are also saved.

At S9 the required multiplication factor is calculated and is stored in a memory. At S10, the payload signal data that is now to be transmitted is multiplied by this stored correction value, thus correcting for any offset or any distortion. At S11 the digital components I' and Q', which have now been corrected, are converted to the amplitude element r and the phase element φ. The phase element and the amplitude element are used for polar modulation of a signal at S12. The modulated signal is transmitted via an antenna.

In the method illustrated in FIG. 6, any offset between the two components I and Q is corrected with the digital components I' and Q'. One nominal value is required for the respective component I or Q in each case for this purpose. This is calculated in advance from the data to be transmitted and on the assumption of ideal conditions.

Figure 7:
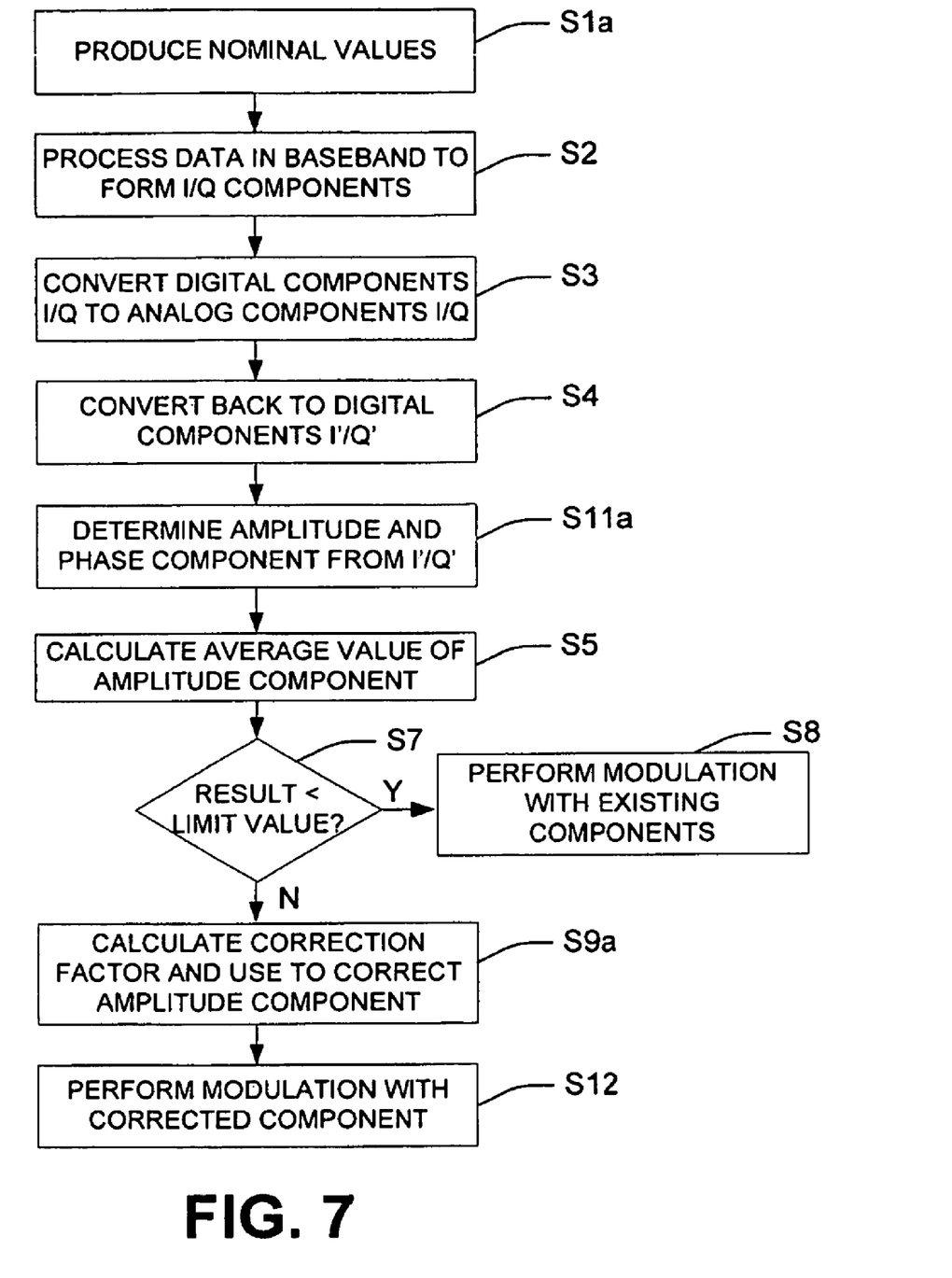
FIG. 7 is a flow chart illustrating a second exemplary embodiment of the method according to the invention.

FIG. 7 shows an alternative embodiment of the method of FIG. 6. In this exemplary embodiment, the data to be transmitted is corrected continuously. In this case, in addition to the data to be transmitted, nominal values are produced at S1a and represent the ideal case of the amplitude element. The data to be transmitted is processed in baseband at S2, and is modulated on the respective components I and Q. They are then converted to analog components I and Q at S3. In practice, this also leads to an impairment as a result of the component tolerances of analog circuit elements.

At S4, the analog components I and Q which have now been modified are converted back, with the payload data, to digital components I' and Q'. They are then filtered in order to suppress higher-frequency components.

At S11a, the amplitude element r and the phase element φ are determined from the digital components I' and Q'. An average value is calculated from the amplitude element r at S5, and a check is carried out at S7 to determine whether this is less than a limit value. If this is the case, phase and amplitude modulation can be carried out with the existing components r and φ at S8, and the corresponding payload signals are transmitted.

Otherwise, a correction factor is calculated at S9a and is used to correct the amplitude element r. This is done by multiplication of the correction factor by the digital amplitude element r at S9a. At the same time, the correction value is stored in this act, for subsequent correction operations. The phase element and the modified amplitude element are then used for polar modulation of a carrier signal.

In one example the method is repeated at regular intervals during data transmission in order to compensate for dynamic effects, for example as a result of temperature fluctuations. In the case of systems which operate with time-slot-based transmissions, it is particularly simple to carry out the method between two payload data transmissions.

The exemplary embodiments of the method according to the invention described here can be combined in the various acts. For example, it is normally possible in the case of continuous data transmission methods to compare the digital components I' and Q' with their respective ideal values, and to determine a correction factor from this. In the same way, a measurement and a correction for time-slot-based data transmission methods are carried out both as illustrated in FIG. 6 with the digital components I and Q and with the amplitude element r or a phase element φ.

The method described here allows baseband signal processing and subsequent correction for possible impairments on the basis of analog circuits within the I/Q signal path without having to carry out any predistortion within the baseband signal processing. This makes it possible to implement a baseband signal unit and the radio-frequency unit in two different semiconductor bodies as integrated circuits, and to optimize these independently of one another. A correction factor is determined in a particularly simple manner by dividing a predetermined nominal value by the average value of the respective component. In this example, the nominal value can be predetermined externally by means of an external control signal or can be stored in advance within the signal processing device. The elements of the exemplary embodiments of the signal processing circuit described here can be combined. In particular, any correction is not restricted, as described here, just to an amplitude element of the individual components. A phase correction value can likewise be determined, and the correction value can then be applied to the corresponding component.

Although the invention has been illustrated and described with respect to a certain aspect or various aspects, it is obvious that equivalent alterations and modifications will occur to others skilled in the art upon the reading and understanding of this specification and the annexed drawings. In particular regard to the various functions performed by the above described components (e.g., assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising." Also, exemplary is merely intended to mean an example, rather than the best.

The invention claimed is:

1. A signal processing device, comprising:
    a signal input comprising a first terminal and a second terminal, the first terminal configured to receive a first input signal component corresponding to an in-phase signal component, and the second input terminal configured to receive a second input signal component corresponding to a quadrature component;
    a modulation unit comprising two input terminals and two output terminals, wherein the two input terminals are coupled to the first and second input terminals, and wherein the modulation unit is configured to convert the first component and the second component of the input signal at its input terminals to a third component that represents an amplitude portion of the signal at its input terminals, and a fourth component that represents a phase portion of the signal at its input terminals;
    a correction device comprising a control input terminal configured to receive a reference signal, comprising a signal terminal configured to receive at least one of the first and second components of the input signal or at least one of the third and fourth components, wherein the correction device is configured to generate a control signal dependent on a comparison of the reference signal with a signal at the signal terminal; and a multiplier comprising a control input connected to the correction device, and configured to change at least one of the first and second components of the input signal or at least one of the third and fourth components as a function of the control signal provided by the correction device.

2. The signal processing device of claim 1, wherein the first and second components of the input signal comprise analog components.

3. A signal processing device, comprising:

a signal input comprising a first terminal and a second terminal, the first terminal configured to receive a first input signal component and the second input terminal configured to receive a second input signal component;

a modulation unit comprising two input terminals and two output terminals, wherein the two input terminals are coupled to the first and second input terminals, and wherein the modulation unit is configured to convert the first component and the second component of the input signal at its input terminals to a third component that represents an amplitude portion of the signal at its input terminals, and a fourth component that represents a phase portion of the signal at its input terminals;

a correction device comprising a control input terminal configured to receive a reference signal, comprising a signal terminal configured to receive at least one of the first and second components of the input signal or at least one of the third and fourth components, wherein the correction device is configured to generate a control signal dependent on a comparison of the reference signal with a signal at the signal terminal; and a multiplier comprising a control input connected to the correction device, and configured to change at least one of the first and second components of the input signal or at least one of the third and fourth components as a function of the control signal provided by the correction device wherein the signal processing device further comprises a first and a second analog/digital converter, wherein the first analog/digital converter is coupled to the first terminal, and the second analog/digital converter is coupled to the second terminal, wherein the first and second analog/digital converters are configured to convert the first and the second components of the input signal to a first and a second digital component, respectively.

4. The signal processing device of claim 3, wherein the multiplier is coupled between one of the two analog/digital converters and one of the two input terminals of the modulation unit, and wherein a signal input of the correction device is coupled to a signal input of the multiplier.

5. The signal processing device of claim 3, wherein the multiplier is configured to multiply an amplitude of at least one of the components by a factor that is derived from the control signal.

6. The signal processing device of claim 3, further comprising a filter device coupled between the first and second terminals of the signal processing device and the first and second analog/digital converters.

7. The signal processing device of claim 3, wherein each of the outputs of the first and second analog/digital converters is followed by a respective digital filter with a low-pass filter characteristic.

8. The signal processing device of claim 1, wherein the multiplier and the correction device are coupled to an output of the modulation unit associated with the third component, and wherein the correction device is configured to generate the control signal and provide the control signal to the multiplier, which is configured to change the amplitude of the third component based on the control signal.

9. The signal processing device of claim 1, wherein the correction device is configured to divide the nominal value by a factor that is derived from the one of the first and second of the input signal or one of the third and fourth components.

10. The signal processing device of claim 7, wherein the correction device is configured to form an average value from the one of the first, second, third and fourth components.

11. The signal processing device of claim 1, further comprising a polar modulator coupled to the output connections of the modulation device, and configured to receive and process the third and the fourth components.

12. The signal processing device of claim 1, wherein the output connection of the modulation device associated with the fourth component is coupled to a phase modulator.

13. The signal processing device of claim 1, wherein the signal processing device comprises an integrated circuit in a semiconductor body.

14. A method for signal processing, comprising:

(a) receiving an input signal comprising a first component and a second component;

(b) converting the first component and the second component to a third component that represents an amplitude portion of the input signal, and a fourth component that represents a phase portion of the input signal;

(c) providing a nominal value associated with ideal components;

(d) comparing the nominal value with at least one of the first, second and third components;

(e) producing a control signal based on the comparison; and (f) using the control signal to change the compared component.

15. The method of claim 14, wherein the input signal comprises an analog signal with a first analog component and a second analog component.

16. The method of claim 15, wherein after act (a), converting the first analog component to a first digital component, and the second analog component to a second digital component; and in act (b), converting the first and the second digital components to digital third and fourth components.

17. The method of claim 16, wherein comparing the nominal value with one of the components comprises:

ascertaining a digital value of the nominal value associated with one of the first, second, third or fourth components, wherein the digital value comprises an average value of the respective component; and dividing the nominal value by the digital value to generate the control signal.

18. The method of claim 14, wherein the comparison of the nominal value with the first or second component and acts (e) and (f) are carried out before act (b).

19. The method of claim 14, wherein the comparison of the nominal value with the third component and acts (e) and (f) are carried out after act (b).

20. The method of claim 14, wherein using the control signal comprises multiplying the compared component with the control signal.

* * * * *